United States Patent
Usner et al.

(10) Patent No.: US 7,207,107 B2
(45) Date of Patent: *Apr. 24, 2007

(54) METHOD AND DEVICE FOR THROUGH-HOLE PLATING OF SUBSTRATES AND PRINTED CIRCUIT BOARDS

(75) Inventors: Juergen Usner, Munich (DE); Ando Welling, Isen (DE)

(73) Assignee: Giesecke & Devrient GmbH, Munich (DE)

( * ) Notice: Subject to any disclaimer, the term of this patent is extended or adjusted under 35 U.S.C. 154(b) by 17 days.

This patent is subject to a terminal disclaimer.

(21) Appl. No.: 10/495,564

(22) PCT Filed: Nov. 14, 2002

(86) PCT No.: PCT/EP02/12774

§ 371 (c)(1),
(2), (4) Date: Feb. 16, 2005

(87) PCT Pub. No.: WO03/043394

PCT Pub. Date: May 22, 2003

(65) Prior Publication Data

US 2005/0125997 A1    Jun. 16, 2005

(30) Foreign Application Priority Data

Nov. 16, 2001  (DE) ............................. 101 56 395

(51) Int. Cl.
    *H05K 3/02* (2006.01)
(52) U.S. Cl. ............................. 29/847; 29/564; 29/729; 29/825; 29/829; 29/835; 83/862; 361/720; 438/613

(58) Field of Classification Search ............. 29/243.58, 29/521, 566.1, 729, 825, 830, 831, 846, 847, 29/852, 853; 72/325–330; 83/34, 56, 217, 83/862, 51; 174/261, 262; 361/772, 773, 361/774; 439/55, 391, 392, 393, 613; 257/700
See application file for complete search history.

(56) References Cited

U.S. PATENT DOCUMENTS 2,426,670 A * 9/1947 Cooley ..................... 29/21.1

(Continued)

FOREIGN PATENT DOCUMENTS

| DE | 21 07 591 A | 8/1972 |
| DE | 30 17 320 A | 11/1981 |
| DE | 101 22 414 A1 | 11/2002 |
| DE | 101 56 395 A1 | 5/2003 |
| JP | 01 125892 A | 8/1989 |
| JP | 08 071981 A | 3/1996 |

*Primary Examiner*—Minh Trinh
*Assistant Examiner*—Donghai D. Nguyen
(74) *Attorney, Agent, or Firm*—Rothwell, Figg, Ernst & Manbeck, PC

(57) ABSTRACT

A method and apparatus for through-contacting flexible substrates 1, in particular circuit boards, having electrically conductive contact zones 4, 41 present on two opposing surfaces 1a, 1b of the substrate provides that a cut 11 is produced obliquely to the surfaces of the substrate in the area of the contact zones, and the two substrate areas 20, 30 adjoining the oblique cut are moved past each other until they lock behind each other. Moving them past each other is effected by a ram 12, by the action of compressed air 13, by applying a vacuum 14 or by a driving hook 15 fixed to the cutting tool. The two steps of producing the cut and moving the two substrate areas adjoining the cut past each other are effected in a common processing station, preferably in a single operation.

12 Claims, 4 Drawing Sheets

U.S. PATENT DOCUMENTS 3,977,074 A * 8/1976 Furnival ...................... 29/853
4,121,044 A   10/1978 Hadersbeck et al.
5,718,142 A * 2/1998 Ferraro ....................... 72/326
6,705,147 B2 * 3/2004 Judge ........................ 72/325
7,000,845 B2 * 2/2006 Welling et al. ............. 361/769

* cited by examiner

FIG. 1A
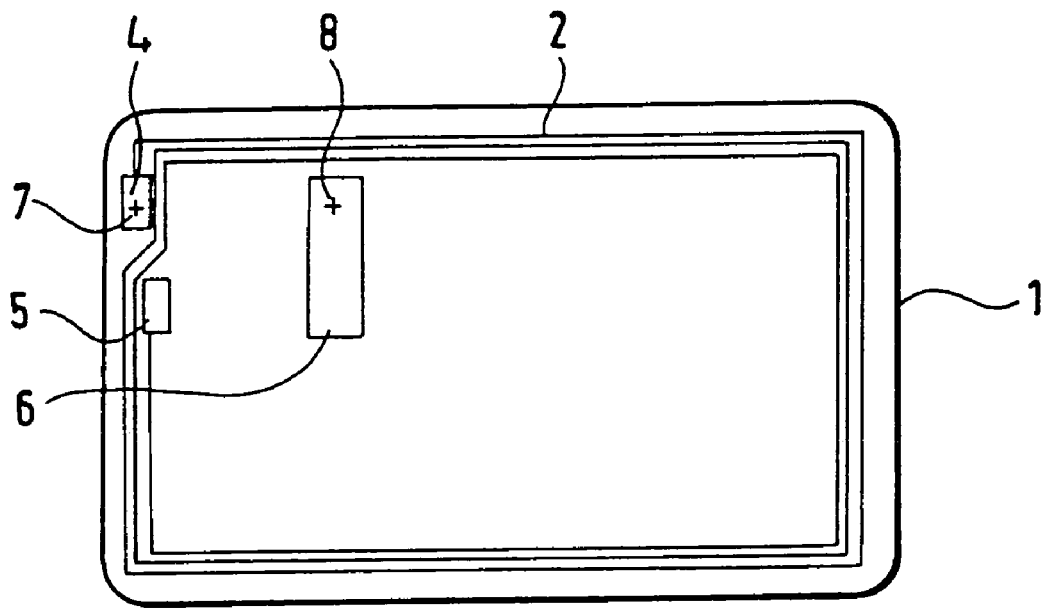
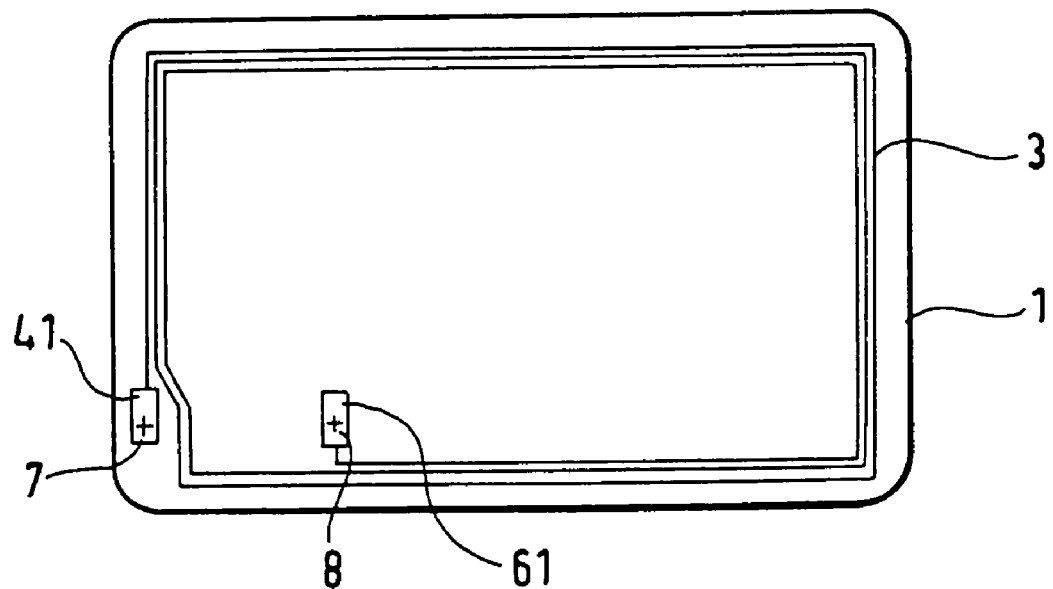
FIG. 1B

METHOD AND DEVICE FOR THROUGH-HOLE PLATING OF SUBSTRATES AND PRINTED CIRCUIT BOARDS

CROSS-REFERENCE TO RELATED APPLICATIONS

This application is a National Stage of International Application No. PCT/EP02/12774, filed Nov. 14, 2002 and claims the priority of DE 101 56 395.7, filed Nov. 16, 2001.

FIELD OF THE INVENTION

This invention relates to a method and apparatus for through-contacting flexible substrates, in particular circuit boards, having electrically conductive contact zones disposed on two opposing surfaces of the substrate, whereby a cut is produced by means of a cutting tool through the substrate obliquely to the surfaces of the substrate in the area of the contact zones, and the two substrate areas adjoining the oblique cut are moved past each other until they lock behind each other. This achieves the result that they touch the contact zones disposed on the opposite surfaces of the substrate, that is, the contact zone on the upper side of the substrate touches the contact zone on the underside of the substrate.

DESCRIPTION OF THE BACKGROUND ART

Such a method is described in the unpublished patent application DE 101 22 414.1. Compared to conventional through-contacting methods by which through-contacting is effected by punching or drilling a through hole and inserting a conductive contact sleeve or pouring in a conductive paste (EP-A-0 884 973), this method is fundamentally simpler. The surfaces of the substrate can be leveled again by subsequent lamination, which at the same time stabilizes the electrical connection between the two contact zones. No additional conductive material is required for producing the contact since the contact zones press firmly against each other due to the internal stress of the flexible substrate.

Such a substrate or such circuit boards are normally integrated as a card inlay into IC cards or chip cards (identity cards, credit cards, cash cards, etc.) and frequently form a separate layer of the card body. On one side of the circuit board there can be for example an integrated circuit formed by the conductive layer and having further electronic devices, while the conductive layer on the opposite side of the circuit board is formed for example as an antenna coil for noncontacting data interchange and energy transfer with external devices, which is electrically connected with the integrated circuit through the circuit board. This electrical connection through the circuit board is generally designated "through-contacting."

Instead of IC cards, the substrate can also be used in the context of the present invention for tags, stickers and similar security elements with antenna coil technology and/or electronic inlays.

It proves to be problematic in this method that the two working steps to be performed in succession, namely the oblique cut and the urging through of the two substrate areas adjoining the cut (hereinafter also designated "contact tabs" or "through-contacting tabs"), are imprecise and lead to high reject rates. Internal tests with the method therefore required a high expenditure of manual work.

SUMMARY OF THE INVENTION

It is the problem of the present invention to specify a concrete and reliable, simplified method for through-contacting circuit boards and the like as well as an apparatus for carrying out the method.

Therefore, the through-contacting tabs produced by the oblique cut are not pushed past each other manually; this is done mechanically by means of a separate ram or by means of compressed air or by applying a vacuum or automatically during production of the oblique cut by a driving hook fixed to the cutting tool. Single or several of these measures can also be combined with each other. The use of said mechanical aids permits the method to be automated and the reject rate to be reduced.

A special advantage is to be seen in the fact that the mechanical aids for urging through the through-contacting tabs can be combined with the cutting tool for producing the oblique cut in a common processing station. This makes it in particular possible to perform both processing steps with the substrate position unchanged, so that the mechanical aids for urging through the through-contacting tabs always act on the substrate at an exactly predetermined position relative to the previously provided cut.

It is particularly advantageous if the two steps required for through-contacting are effected in a common operation. This goal can be attained for example by the cutting tool with a driving hook fixed thereto by the cutting tool first being pushed through the substrate obliquely to the substrate plane, and one of the two thereby produced through-contacting tabs being urged behind the other through-contacting tab for example by a driving hook fixed to the cutting tool upon further advancing of the cutting tool.

The two steps of producing the cut and urging through the tab can also be integrated into one operation when applying compressed air and/or a vacuum.

Even the use of a separate ram for urging one contacting tab through behind the other contacting tab can be integrated into the working step of producing the oblique cut. In this case the contacting tabs are urged past each other by the ram before the cutting tool is withdrawn from the oblique cut. The cutting tool is preferably realized as a knife blade which is resilient perpendicular to the knife blade plane.

In accordance with a special embodiment of the invention, the cutting edge of the cutting tool is serrated and has at least one tooth. This prevents the knife from slipping after being placed on the flexible substrate and accordingly improves the precision of through-contacting.

BRIEF DESCRIPTION OF THE DRAWINGS

The invention will hereinafter be described by way of example with reference to the accompanying drawings, in which:

FIGS. 1a and 1b show the front and back of a flexible substrate,

DETAILED DESCRIPTION OF THE INVENTION

Figure 2:
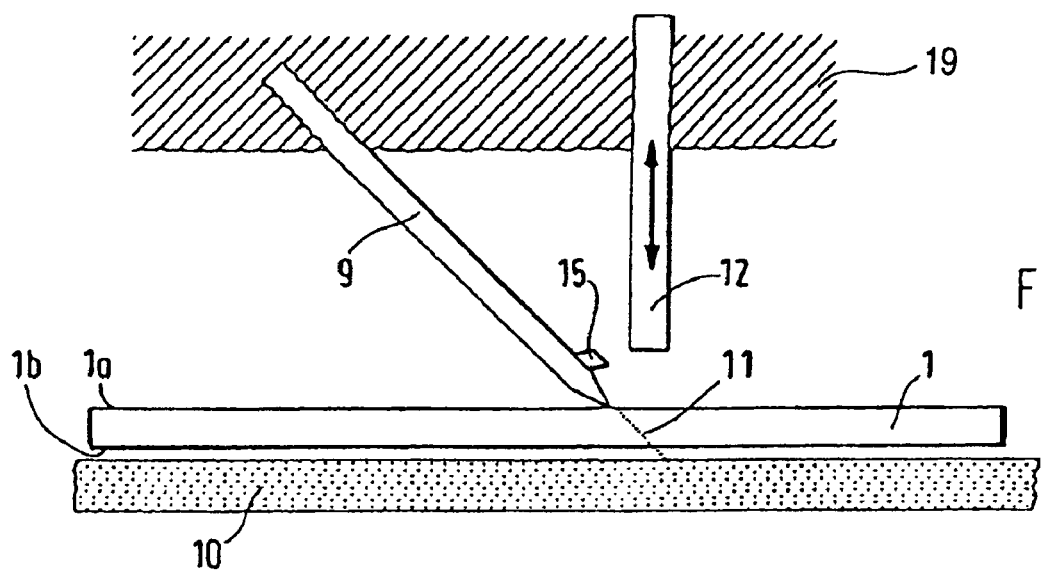
FIG. 2 shows two embodiments of an inventive apparatus for through-contacting the substrate in a side view.

FIG. 1*a* shows the front of a substrate 1 suitable for incorporation into a card body. On this side of the substrate a conductive layer 2 is shown in the form of a coil for noncontacting data and energy exchange with an external device. The coil 2 disposed on this side of the substrate 1 has the contact zones 4 and 5, the contact zone 5 being provided for contacting with an IC module. A further contacting of the coil with the IC module is effected via the contact zone 6 which is connected by a through-contacting at the site 8 with a second electrically conductive layer 3 in the form of a second coil on the back of the substrate 1 (FIG. 1*b*). A further through-contacting of the same type connects the contact zone 4 with the coil 3 at the site 7. The associated contact zones of the coil 3 on the back of the substrate are marked as 61 and 41 in FIG. 1*b*.

Figure 3A:
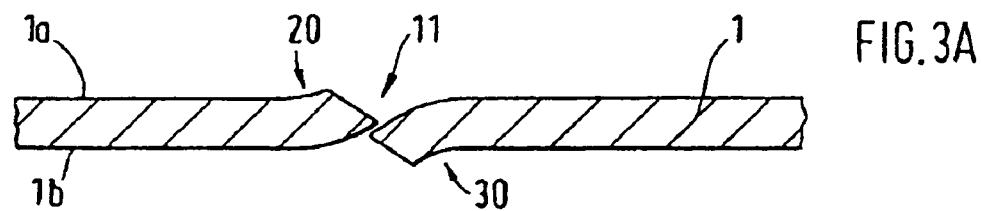
FIGS. 3a and 3b show a substrate through-contacted by means of the apparatus according to FIG. 2 in cross section and in a plan view.

FIG. 2 jointly shows two embodiments of an inventive apparatus for carrying out the through-contacting. The two embodiments have in common that in a processing station the substrate 1 lies on a soft base 10, for example a rubber mat, and, with the position of the substrate unchanged, both a cut 11 is produced obliquely to the surfaces 1*a*, 1*b* of the substrate 1 and the through-contacting tabs 20, 30 formed by the cut are urged past each other until the tab 30 locks behind the other tab 20, as shown in FIG. 3*a*.

The cut 11 in the substrate 1 is preferably produced at a 45° angle relative to the substrate surfaces 1*a*, 1*b*.

The step of moving the two through-contacting tabs 20, 30 past each other is effected by means of a driving hook 15 on the knife 9 in accordance with the first embodiment shown in FIG. 2. To this end, the knife 9 mounted displaceably in the knife holder 19 is first pushed forward in the axial direction to produce the cut 11. Further advancing the knife 9 causes the driving hook 15 to come in contact with the contact tab 30 located on the right of the cut 11 in FIG. 2 and urge it back behind the contact tab 20 located on the left of the cut 11 in FIG. 2 so that the two contact tabs lock behind each other (FIG. 3*a*).

In accordance with the second embodiment shown in FIG. 2, a ram 12 which is movable up and down in the direction of the arrow is used instead of the driving hook 15 for moving the two through-contacting tabs 20, 30 past each other. In this case, the cut 11 is first produced by the knife 9 by the knife 9 being advanced in its axial direction and then, before or after the knife 9 has been moved back to its initial position, the ram 12 is used to again urge the contact tab 30 located on the right of the cut 11 behind the contact tab 20 located on the left of the cut 11. The ram 12 has in this case a comparatively small cross section and urges with this cross section only the central area of the right contact tab 30 under the left contact tab 20.

Figure 3B:
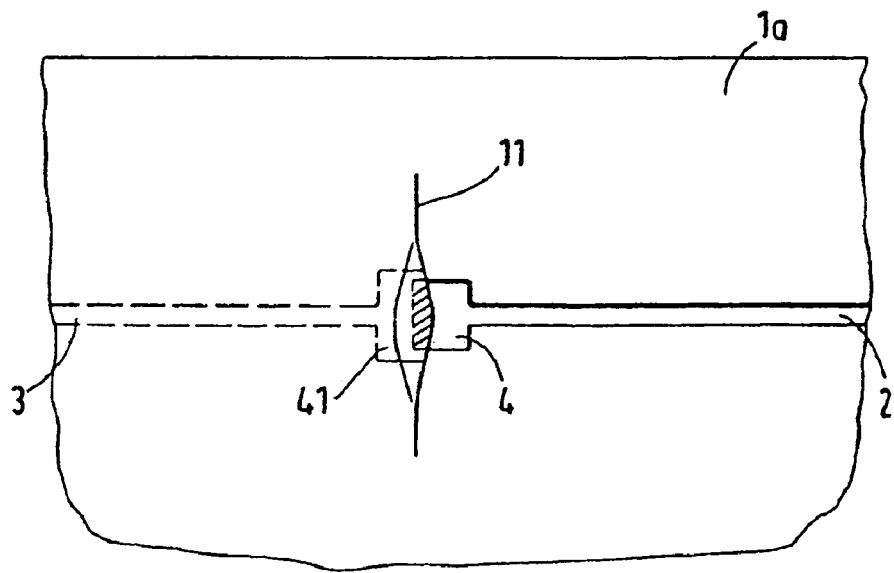

In a plan view, both embodiments result in a through-contacted configuration as shown in FIG. 3*b*. Therefore, the contact tabs 20, 30 overlap with their surfaces 1*a*, 1*b* (FIG. 3*a*) only in a central area of the cut 11. The thereby produced contact area between the contact zones 4 of the coil 2 and the contact zone 41 of the coil 3 is shown hatched in FIG. 3*b*.

After through-contacting is completed in the processing station, the substrate 1 can be removed from the processing station and for example be completed to form a plastic card in a laminating process with further plastic layers and optionally further electronic devices.

Figure 4:
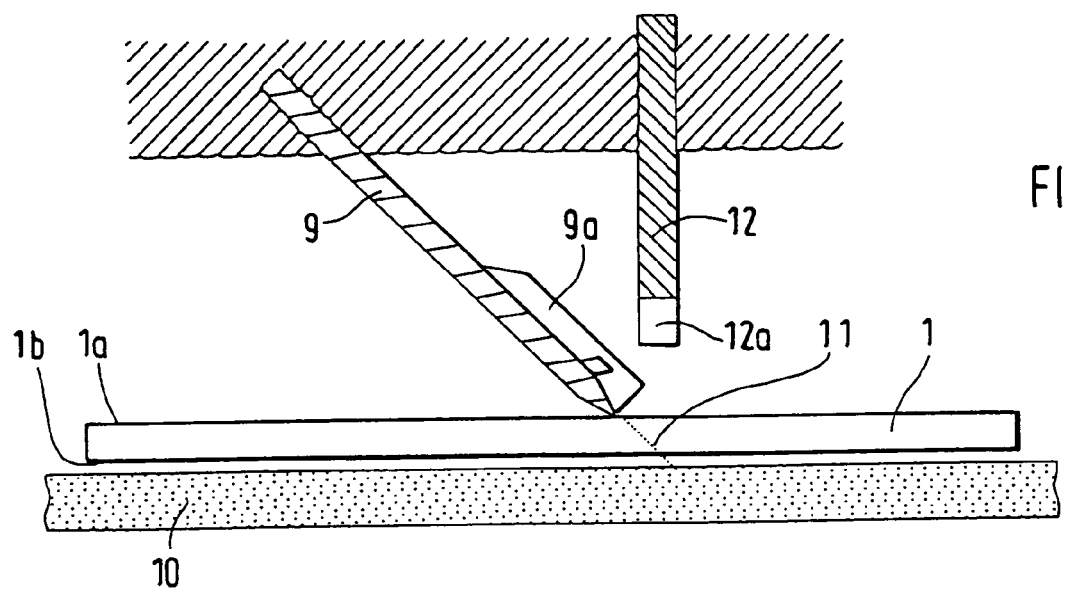
FIG. 4 shows an embodiment of the inventive apparatus according to FIG. 2, FIGS. 5a and 5b show a substrate through-contacted by means of the apparatus according to FIG. 4 in cross section and in a plan view.
Figure 5A:
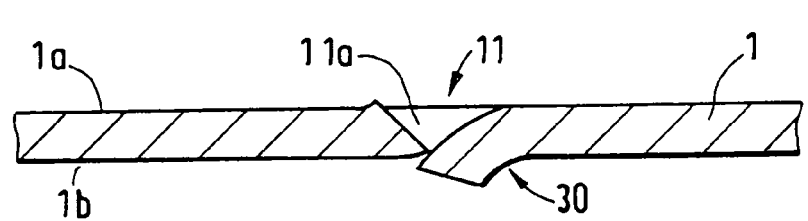
Figure 5B:
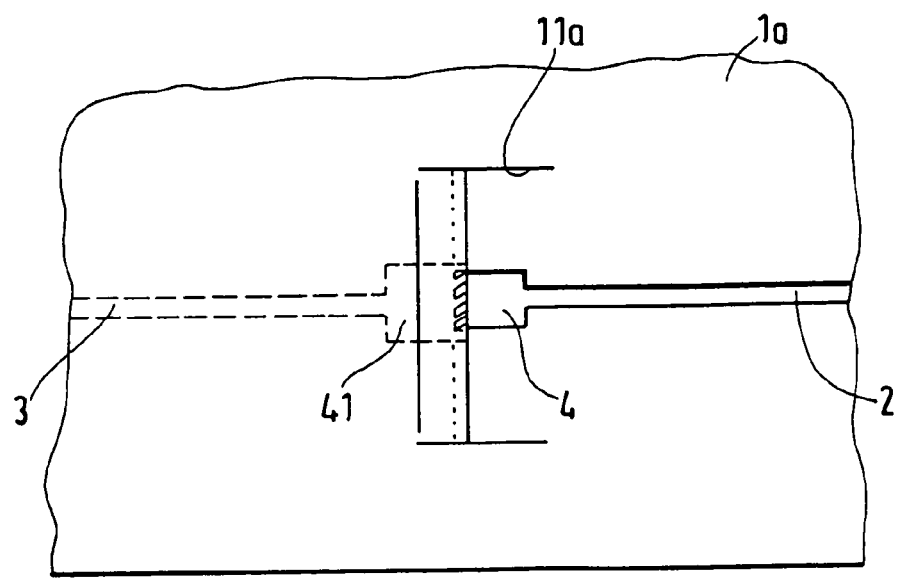

Instead of the ram with a comparatively small cross section as shown in FIG. 2, a ram extending along the total length of the cut 11 can also be used. The driving hook 15, which is preferably comparatively small and placed in the center of the knife 9 in the embodiment according to FIG. 2, can also optionally extend over the total width of the knife 9. In this case, urging the right contact tab 30 through behind the left contact tab 20 leads to tearing of at least the urged through contact tab 30 at the two cut ends. To avoid this, the alternative embodiments to the apparatus from FIG. 2 as shown in FIG. 4 provide that the knife 9 has lateral cutting elements 9*a*, or the ram 12 has lateral cutting elements 12*a*, which ensure that a clean cut 11*a* is produced perpendicular to the transverse extension of the cut 11 either upon production of the cut 11 by the cutting elements 9*a* or upon urging of the contact tabs past each other by the cutting elements 12*a*. The through-contacting tab 30 then has a typical tab form in the stricter sense, as indicated in FIG. 5*a* on the right contacting tab 30 urged downward out of the substrate plane. Said contact tab 30 is separated on three sides from the substrate 1 by the cuts 11 and 11*a* and connected with the substrate 1 on only one side. FIG. 5*b* again shows a plan view of the area of the through-contacting produced by the apparatus from FIG. 4. The concretely contacted surface between the contact zones 4 and 41 is again hatched.

Figure 6:
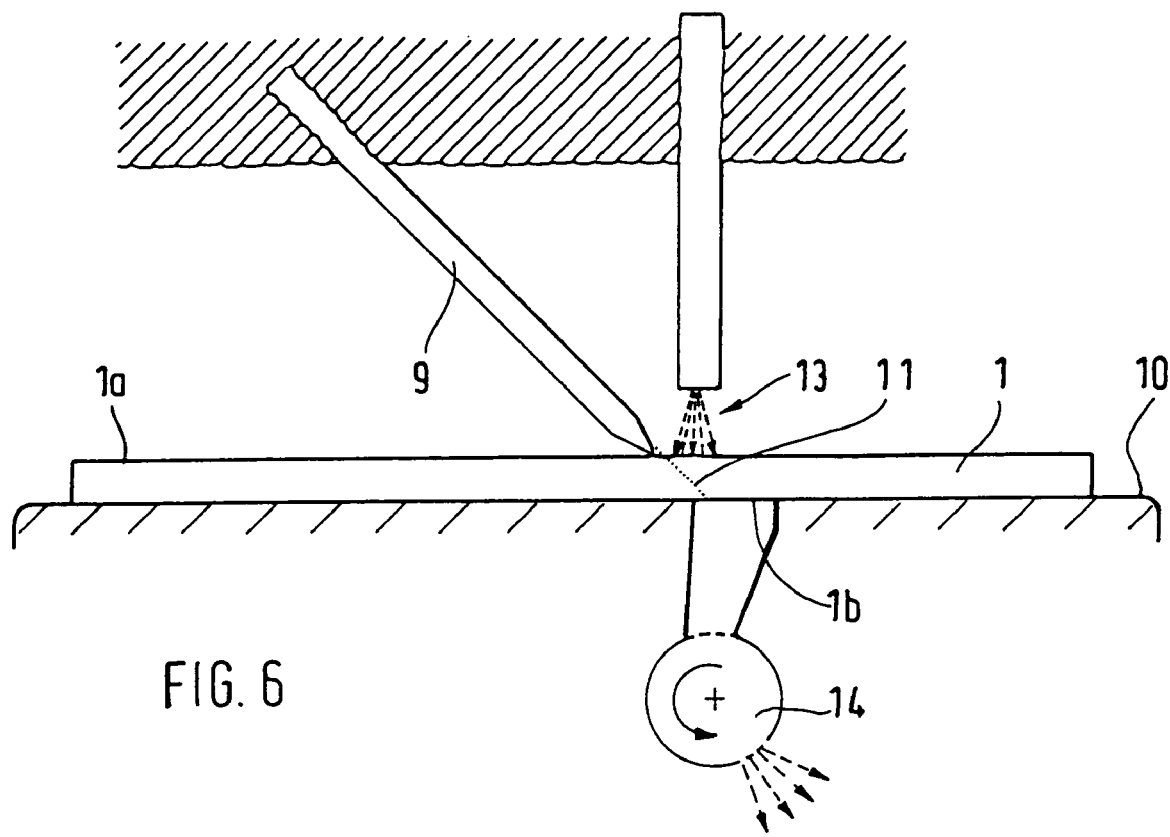
FIG. 6 shows two further embodiments of an inventive apparatus for through-contacting the substrate in a side view.

FIG. 6 again shows jointly in one picture two further embodiments of an inventive apparatus for carrying out the method. In this case, the right contact tab 30 is moved past the left contact tab 20 by compressed air 13 directed to the front 1*a* of the contact tab 30, and/or by a vacuum applied to the back 1*b* of the contact tab by a vacuum pump 14. In this case, the base 10 can be a firm base, since the cut 11 is guided into the suction port of the vacuum pump 14, and the through-contacting tab 30 located on the right of the cut 11 is also moved into said suction port when moving past the contacting tab 20 located on the left of the cut 11.

Figure 7:
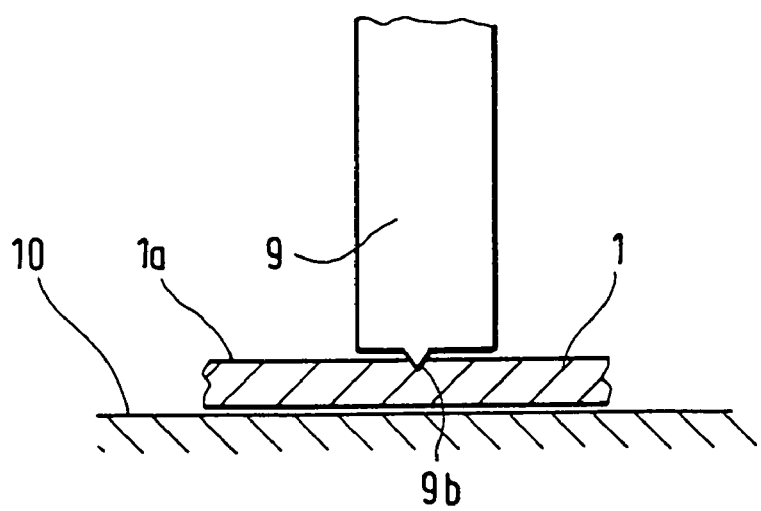
FIG. 7 shows a cutting tool with a serrated cutting edge.

FIG. 7 shows a special embodiment of the knife 9 having a serrated cutting edge. In the embodiment specifically shown, the cutting edge of the knife 9 has a single tooth 9*b* which serves to prevent the knife 9 from slipping after being placed on the surface 1*a* of the substrate 1.

The invention claimed is:

1. A method for through-contacting flexible substrates comprising:
   providing a flexible substrate having first and second, opposite major surfaces;
   providing a pair of electrically conductive contact zones, wherein a first member of said pair is disposed on the first surface and a second member of said pair is disposed on the second, opposite surface;
   forming a cut through said substrate with a cutting tool, the cut being at an oblique angle to said surfaces, wherein said cut is proximate to a first contact area within said first contact zone and a second contact area within said second contact zone and wherein adjacent substrate areas adjoining the oblique cut are moved past each other so as to lock behind each other and bring said first and second contact areas into mutual electrical contact, wherein said adjacent substrate areas are moved past each other and first and second contact areas are brought into electrical contact in one operation with the production of said cut.

2. A method according to claim 1, characterized in that the adjoining substrate areas are moved past each other by means of at least one of a separate ram or a driving device disposed on the cutting tool.

3. A method according to claim 1, characterized in that the adjoining substrate areas are moved past each other by compressed air (13) or production of a vacuum.

4. A method according to claim 1, characterized in that the two steps of producing the cut and moving the two substrate areas past each other are performed with the substrate position unchanged.

5. A method according to claim 1, characterized in that the oblique cut is produced at an angle of 45° to the substrate surfaces.

6. A cutting apparatus comprising:
   means for receiving a planar substrate, said substrate having first and second, opposite major surfaces and a pair of electrically conductive contact zones, wherein a first member of said pair is disposed on said first surface and a second member of said pair is disposed on said second, opposite surface;
   a cutting tool disposed to produce an oblique cut through said major surfaces, wherein said cut is proximate to a first contact area within said first contact zone and a second contact area within said second contact zone and
   a locking device disposed to move said first and second contact areas of said substrate and lock said areas into opposing contact;
   wherein said cutting tool and said locking device are disposed in a common work station.

7. An apparatus according to claim 6, characterized in that the locking device comprises a ram.

8. An apparatus according to claim 6, characterized in that the locking device uses compressed air for moving the two substrate areas adjoining the cut past each other.

9. An apparatus according to claim 6, characterized in that the locking device uses a vacuum for moving the two substrate areas adjoining the cut past each other.

10. An apparatus according to claim 6, characterized in that the locking device comprises a driving hook fixed to the cutting tool.

11. An apparatus according to claim 6, characterized in that the cutting tool has a cutting edge with at least a tooth.

12. An apparatus according to claim 6, characterized in that the cutting tool comprises a knife blade which is resilient perpendicular to the knife blade plane.

* * * * *